United States Patent
Hamm et al.

(10) Patent No.: US 9,076,657 B2
(45) Date of Patent: Jul. 7, 2015

(54) ELECTROCHEMICAL ETCHING OF SEMICONDUCTORS

(71) Applicant: Rohm and Haas Electronic Materials LLC, Marlborough, MA (US)

(72) Inventors: Gary Hamm, Billerica, MA (US); Jason A. Reese, Londonderry, NH (US); George R. Allardyce, Leicestershire (GB)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

(21) Appl. No.: 13/924,547

(22) Filed: Jun. 22, 2013

(65) Prior Publication Data
US 2013/0288476 A1 Oct. 31, 2013

Related U.S. Application Data

(62) Division of application No. 13/324,332, filed on Dec. 13, 2011, now Pat. No. 8,603,314.

(60) Provisional application No. 61/422,597, filed on Dec. 13, 2010.

(51) Int. Cl.
| | |
|---|---|
| C25D 5/34 | (2006.01) |
| H01L 21/288 | (2006.01) |
| H01L 21/465 | (2006.01) |
| C25D 11/00 | (2006.01) |
| C25D 11/02 | (2006.01) |
| C25F 3/12 | (2006.01) |
| C25F 3/00 | (2006.01) |
| H01L 23/00 | (2006.01) |
| C25D 11/32 | (2006.01) |

(Continued)

(52) U.S. Cl.
CPC ............. *H01L 24/03* (2013.01); *C25D 11/32* (2013.01); *C25D 3/12* (2013.01); *C25D 5/00* (2013.01); *C25D 5/12* (2013.01); *C25F 3/12* (2013.01); *C25D 7/123* (2013.01); *H01L 31/022425* (2013.01); *H01L 31/1804* (2013.01); *Y02E 10/547* (2013.01)

(58) Field of Classification Search
CPC ........................................................ C25D 11/32
USPC .................................. 205/640–686, 80–333
See application file for complete search history.

(56) References Cited

U.S. PATENT DOCUMENTS

| | | |
|---|---|---|
| 3,041,255 A | 6/1962 | Passal et al. |
| 3,607,480 A | 9/1971 | Harrap et al. |

(Continued)

FOREIGN PATENT DOCUMENTS

WO    2010065989 A1    6/2010

OTHER PUBLICATIONS

Zimin, S.P.; "Classification of Electrical Properties of Porous Silicon" Semiconductors, vol. 34, 2000, p. 353-357.*

(Continued)

*Primary Examiner* — Nicholas A Smith
*Assistant Examiner* — Brian W Cohen
(74) *Attorney, Agent, or Firm* — John J. Piskorski (57) ABSTRACT

Semiconductors are electrochemically etched in solutions containing sources of bifluoride and nickel ions. The electrochemical etching may form pores in the surface of the semiconductor in the nanometer range. The etched semiconductor is then nickel plated.

6 Claims, 3 Drawing Sheets

(51) Int. Cl.
 C25D 5/00 (2006.01)
 C25D 5/12 (2006.01)
 C25D 7/12 (2006.01)
 H01L 31/0224 (2006.01)
 H01L 31/18 (2006.01)
 C25D 3/12 (2006.01)

(56) References Cited

U.S. PATENT DOCUMENTS

| | | | | |
|---|---|---|---|---|
| 4,369,099 | A * | 1/1983 | Kohl et al. | 205/646 |
| 4,801,360 | A | 1/1989 | Tanner | |
| 5,501,787 | A * | 3/1996 | Bassous et al. | 205/124 |
| 5,543,333 | A | 8/1996 | Holdermann | |
| 5,599,520 | A | 2/1997 | Garces et al. | |
| 6,277,662 | B1 * | 8/2001 | Nagata | 438/22 |
| 6,787,450 | B2 | 9/2004 | Sinha et al. | |
| 7,192,860 | B2 | 3/2007 | McFarland et al. | |
| 7,399,365 | B2 | 7/2008 | Aoyama et al. | |
| 2006/0166474 | A1 | 7/2006 | Vereecken et al. | |
| 2006/0215154 | A1 | 9/2006 | Chan et al. | |
| 2006/0272950 | A1 * | 12/2006 | Martyak et al. | 205/261 |
| 2009/0057154 | A1 | 3/2009 | Basker et al. | |
| 2009/0139868 | A1 * | 6/2009 | Shrader et al. | 205/118 |
| 2009/0188553 | A1 * | 7/2009 | Dubin | 136/256 |
| 2009/0196999 | A1 * | 8/2009 | Egli et al. | 427/307 |
| 2010/0029077 | A1 * | 2/2010 | Barr et al. | 438/652 |
| 2010/0075157 | A1 * | 3/2010 | Petrmichl et al. | 428/432 |
| 2010/0197144 | A1 | 8/2010 | Dove et al. | |
| 2011/0287634 | A1 | 11/2011 | Barr et al. | |
| 2011/0306534 | A1 * | 12/2011 | Hsu et al. | 510/176 |
| 2012/0145553 | A1 | 6/2012 | Kramer et al. | |
| 2012/0231326 | A1 * | 9/2012 | Biswal et al. | 429/163 |

OTHER PUBLICATIONS

Beale et al.; "An Experimental and Theoretical Study of the Formation and Microstructure of Porous Silicon"; Journal of Crystal Growth 73 (1985) pp. 622-636.

Kumar et al.; "Effect of HF Concetration on Phyiscal and Electronic Properties of Electrochemically Formed Nanoporous Silicon"; Journal of Nanomaterials, vol. 2009, Jan. 2009; Article ID 728957, 7 pages.

Kim et al.; "Silicon Solar Cell with Nanoporous Structure Formed on a Textured Surface"; J. Am . Ceram. Soc., 92[10] 2009; pp. 2415-2417.

Waheed A. Badawy; "Porous Silicon Modified Photovoltaic Junctions an Approach to High-Efficiency Solar Cells and Environmentally Safe Energy Conversion"; ISESCO Science and Technology Vision, vol. 3, No. 3; May 2007; pp. 43-48.

Jeong Kim; Journal of the Korean Physical Society, vol. 50, No. 4, Apr. 2007; pp. 1168-1171.

Hungarian Intellectual Property Office Search Report within corresponding Singapore Application No. 201109165-9.

* cited by examiner

ELECTROCHEMICAL ETCHING OF SEMICONDUCTORS

This application is a Divisional Application of U.S. Non-Provisional application Ser. No. 13/324,332 now U.S. Pat. No. 8,603,314, filed Dec. 13, 2011 which application claims the benefit of priority under 35 U.S.C. §119(e) to U.S. Provisional Application No. 61/422,597, filed Dec. 13, 2010, the entire contents of which application are incorporated herein by reference.

The present invention is directed to a method of electrochemical etching of semiconductors. More specifically, the present invention is directed to a method of electrochemical etching of semiconductors to improve metal adhesion to the semiconductors.

Metal plating of semiconductors, such as photovoltaics and solar cells, involves the formation of electrically conductive contacts on front and back sides of the semiconductors. The metal coating must be able to establish ohmic contact with the semiconductor in order to ensure that charge carriers emerge from the semiconductor into the electrically conductive contacts without interference. In order to minimize current loss, metallized contact grids must have adequate current conductivities, i.e. a high conductivity or a sufficiently high conductor track cross section.

Numerous processes which meet the above requirements exist for metal coating the back sides of solar cells. For example, in order to improve current conduction at the back side of solar cells, p-doping directly under the back side is reinforced. Usually aluminum is used for this purpose. The aluminum is applied, for example, by vapor deposition or by being printed onto the back side and being driven in or, respectively, alloyed in. When metal coating the front side, or light incidence side, the objective is to achieve the least amount of shading of the active semiconductor surface in order to use as much of the surface as possible for capturing photons.

Metal coatings using thick-film techniques are conventional methods for metallizing conductor tracks. Pastes used include metal particles and are electrically conductive as a result. The pastes are applied by screen, mask, pad printing or paste writing. A commonly used process is the screen printing process where finger-shaped metal coating lines having a minimum line width of 80 μm to 100 μm are made. Even at this grid width electrical conductivity losses are evident and contact resistance is higher in comparison with a pure metal structure. This can have an adverse effect on the series resistance and on the fill factor and efficiency of the solar cell. This effect is intensified at smaller printed-on conductor track widths because less silver metal is applied from paste as the line width is reduced. Nonconductive oxide and glass components between the metal particles constitute a fundamental cause of this reduced conductivity.

More complex processes for producing the front side contacts make use of laser or photographic techniques for the definition of the conductor track structures. The conductor tracks are then metallized. In general, various metal coating steps are often used in order to apply the metal coating in attempting to achieve sufficient adhesive strength and a desired thickness for electrical conductivity. For example, when wet-chemical metal coating processes are used, a first fine metal coating is deposited on the current tracks by means of palladium catalyst. This is often reinforced with electroless deposition of nickel. In order to increase the conductivity, copper may be deposited on the nickel by electroless or electrolytic deposition. The copper may then be coated with a fine layer of tin or silver to protect it from oxidation.

Adhesion of plated nickel deposits to silicon semiconductor wafers is primarily impacted by the surface topography of the substrate and internal stress of the plated deposit. Nickel adhesion to the wafer is also impacted by stress induced by additional plated layers deposited on top of the nickel. The surface topography of the semiconductor wafers varies significantly from one manufacturer to another and based on semiconductor type, e.g. monocrystalline or polycrystalline. In many cases the surface texture does not provide sufficient anchoring of the plated metal deposit without unacceptable levels of adhesion loss. One method of addressing this adhesion problem is to sinter the semiconductor wafer immediately after plating nickel to form nickel silicide. The nickel silicide provides sufficient bond strength for subsequent metal plating with copper or silver while maintaining good adhesion. However, this requires the use of a controlled atmosphere at sinter and divides the plating operation into two steps which complicates the manufacturing process. In addition there is more potential for damage to the diode or performance loss due to shunting. Further there is increased process time and cost. Accordingly, there is a need for an improved method of metal adhesion to the semiconductor wafer.

Methods include: a) providing a semiconductor wafer including a front side including an oxidized emitter layer, a back side and a PN junction; b) contacting the semiconductor wafer with a composition including one or more sources of bifluorides, one or more fluoride salts, or mixtures thereof and one or more sources of metal ions; c) generating an electrical current in the composition; d) applying anodic current for a predetermined period of time, followed by turning the anodic current off for a predetermined period of time and repeating the cycle to form a nanoporous layer on the oxidized emitter layer of the semiconductor wafer; and e) applying cathodic current and light to deposit metal on the nanoporous layer.

Methods also include: a) providing a semiconductor wafer including a front side including an oxidized emitter layer, a back side and a PN junction; b) contacting the semiconductor wafer with a composition including one or more sources of bifluorides, one or more fluoride salts, or mixtures thereof; c) generating an electrical current in the composition; d) applying anodic current for a predetermined time, followed by turning the anodic current off for a predetermined time and repeating the cycle to form a nanoporous layer on the oxidized emitter layer of the semiconductor wafer; e) contacting the semiconductor wafer with a metal plating solution; and f) generating an electrical current in the metal plating solution to deposit metal on the nanoporous layer.

The methods form substantially uniform nanoporous layers on the oxidized emitter layer of semiconductor wafers. The nanoporous layers provide improved adhesion between the metal deposit and the semiconductor wafer. In addition the anodic pulsing process used to form the nanoporous layers does not penetrate the oxidized emitter layer of the semiconductor wafer such that the emitter is damaged to a degree where ohmic contact between the metal layer and the semiconductor wafer is compromised. Subsequent metal layers may then be deposited on the initial metal layer without concern for adhesion failure, thus improving the reliability of devices which include the metalized semiconductor. In addition, the method may eliminate the need for forming a metal silicide and the complicated steps involved in the silicide process.

As used throughout this specification, the terms "depositing" and "plating" are used interchangeably. The terms "current tracks" and "current lines" are used interchangeably. The terms "composition" and "bath" are used interchangeably. The indefinite articles "a" and "an" are intended to include both the singular and the plural. The term "selectively depositing" means that metal deposition occurs in specific desired areas on a substrate. The term "lux=lx" is a unit of illumination equal to one lumen/m$^2$; and one lux=1.46 milliwatt of radiant electromagnetic (EM) power at a frequency of 540 tetrahertz. The following abbreviations have the following meanings unless the context clearly indicates otherwise: ° C.=degrees Celsius; g=grams; mL=milliliter; L=liter; A=amperes; dm=decimeter; cm=centimeter; μm=micrometers; nm=nanometers; min.=minute; sec.=second; UV=ultra violet; IR=infrared; SEM=scanning electron microscope; and ASTM=American Standard Testing Method. All percentages and ratios are by weight unless otherwise indicated. All ranges are inclusive and combinable in any order except where it is clear that such numerical ranges are constrained to add up to 100%.

Photovoltaics and solar cells may be composed of monocrystalline, polycrystalline or amorphous silicon semiconductor wafers. While the description below is with regard to silicon semiconductor wafers, other suitable semiconductor wafers, such as gallium-arsenide, silicon-germanium, and germanium, may also be used. When silicon wafers are used, they typically have a p-type base doping.

The semiconductor wafers may be circular, square or rectangular in shape or may be any other suitable shape. Such wafers may have a wide variety of dimensions and surface resistivities. For example, circular wafers may have a diameter of 150 mm, 200 mm, 300 mm, 400 mm, or greater.

The back side of a wafer is metalized. Any conventional method may be used. The entire back side may be metal coated or a portion of the back side may be metal coated, such as to form a grid. Such back side metallization may be provided by a variety of techniques, and may be done prior to the metallization of the front side of the wafer. In one embodiment, a metal coating is applied to the back side in the form of an electrically conductive paste, such as a silver-containing paste, an aluminum-containing paste or a silver and aluminum-containing paste; however, other pastes which include metals such as nickel, palladium, copper, zinc or tin also may be used. Such conductive pastes typically include conductive particles embedded in a glass matrix and an organic binder. Conductive pastes may be applied to the wafer by a variety of techniques, such as screen printing. After the paste is applied, it is fired to remove the organic binder. When a conductive paste containing aluminum is used, the aluminum partially diffuses into the back side of the wafer, or if used in a paste also containing silver, may alloy with the silver. Use of such aluminum-containing paste may improve the resistive contact and provide a "p+"-doped region. Heavily doped "p+"-type regions by previous application of aluminum or boron with subsequent interdiffusion may also be produced. In one embodiment, an aluminum-containing paste may be applied to the back side and fired before the application of the back side metal coating. The residue from the fired aluminum-containing paste may optionally be removed prior to the application of the back side metal coating. In an alternate embodiment, a seed layer may be deposited on the back side of the wafer and a metal coating may be deposited on the seed layer by electroless or electrolytic plating.

The front side of the wafer may optionally be subjected to crystal-oriented texture etching in order to impart to the surface an improved light incidence geometry which reduces reflections, such as the formation of pyramid structures. To produce the semiconductor junction, phosphorus diffusion or ion implantation takes place on the front side of the wafer to produce an n-doped (n+ or n++) region and provides the wafer with a PN junction. The n-doped region may be referred to as the emitter layer. The emitter layer may be a homogeneous emitter layer or a selective emitter layer. A homogeneous emitter layer has a generally uniform dopant concentration or sheet resistance. A selective emitter layer has multiple sheet resistance values. Typically, regions where the current tracks are located the sheet resistance is lower or of higher doping and regions of antireflective coating is higher resistance or lower doping. A selective emitter layer may be preferred because of the higher doping and lower resistance of the current tracks which bias nanoporous formation.

An anti-reflective layer is added to the front side or emitter layer of the wafer. In addition the anti-reflective layer may serve as a passivation layer. Suitable anti-reflective layers include, without limitation, silicon oxide layers such as $SiO_x$, silicon nitride layers such as $Si_3N_4$, a combination of silicon oxide and silicon nitride layers, and combinations of a silicon oxide layer, a silicon nitride layer with a titanium oxide layer such as $TiO_x$. In the foregoing formulae, x is the number of oxygen atoms. Such anti-reflective layers may be deposited by a number of techniques, such as by various vapor deposition methods, for example, chemical vapor deposition and physical vapor deposition.

The front side of a wafer contains a metalized pattern. For example, the front side of a wafer may be composed of current collecting lines and current busbars. Current collecting lines are typically transverse to the busbars and typically have a relatively fine-structure (i.e. dimensions) relative to current busbars.

In one embodiment, the front side or emitter layer of the wafer is coated with an antireflective layer, such as silicon nitride. An opening or pattern is then defined on the front side. The pattern reaches through the antireflective layer to expose the surface of the semiconductor body of the wafer. Alternatively trenches may be formed in the openings which penetrate the surface of the wafer to a depth of 1 to 100 μm into the semiconductor body of the wafer. Deeper or shallower trench depths may be employed. A variety of processes may be used to form the pattern, such as, but not limited to, laser ablation, mechanical means, and lithographic processes, all of which are well known in the art. Such mechanical means include sawing and scratching. Typical photolithographic processes include disposing an imageable material on the surface of the wafer, patterning the imageable material to form openings in the anti-reflective layer, transferring the pattern to the wafer, depositing a metal layer in the openings and removing the imageable material. In one embodiment, the imageable material is removed before the step of depositing a metal layer in the openings. In another embodiment, the imageable material is removed after the step of depositing a metal layer in the openings. When the imageable material is present during the metal deposition step, such imageable material typically avoids any dyes, such as contrast dyes, that absorb in the wavelength of radiation used during the metal deposition step. Imageable material present during the plating step typically contains a dye which has a minimum light transmittance of 40-60%.

When the imageable material is a liquid, such material may be disposed on the surface of the wafer by any suitable technique such as, but not limited to, by spin coating, inkjet printing, curtain coating, and roller coating. When the imageable material is a dry film, such material may be disposed on the surface of the wafer by vacuum lamination.

The imageable material is patterned by exposing the imageable material to actinic radiation through a mask. The choice of actinic radiation will depend upon the particular imageable material selected. Lasers as well as other conventional sources of actinic radiation may be used to pattern the imageable material.

The pattern in the imageable material is next transferred to the semiconductor wafer substrate. Pattern transfer may be performed using wet chemical etching techniques or by using dry etching techniques. Suitable dry etching techniques include, without limitation, plasma etching such as reactive ion etching. The pattern typically is composed of lines of relatively narrow cross-sectional dimension which are current collecting lines and lines of relatively thick cross-sectional dimension which are busbars. The busbars are transverse to the current collecting lines.

The imageable material may be removed using any suitable polymer remover, such as those sold by Rohm and Haas Electronic Materials (Marlborough, Mass.). Such removers may be alkaline, acidic or essentially neutral.

The exposed sections of the semiconductor wafer which form the pattern are oxidized to restore any native oxide removed during any previous cleaning or handling of the wafer. Conventional oxidizing agents may be used to restore native oxide. Oxidation is typically done with a 1-3 wt % aqueous solution of hydrogen peroxide. Other oxidizing agents include, but are not limited to, aqueous solutions of hypochlorite, persulfates, peroxyorganic acids and permanganate. When the semiconductor wafer is monocrystalline, typically the oxidizing solutions are alkaline with a pH greater than 7, or such as from 8-12. When the semiconductor wafer is of silicon, a layer of $SiO_x$ is formed on the exposed sections. Typically the semiconductor wafer is dipped or processed through a flooded process chamber containing the oxidizing solution. Oxidation may also occur naturally by exposing the semiconductor wafer to the ambient atmosphere.

The exposed sections or pattern of the semiconductor wafer are then etched to form a nanoporous layer on the oxidized emitter layer followed by metal plating with an electrochemical etching and metal plating composition including one or more sources of bifluorides, one or more fluoride salts or mixtures thereof and one or more sources of metal ions. Accordingly, the composition includes both the etching components and the metal plating components. In an alternative embodiment the etching with the one or more sources of bifluorides, fluoride salts, or mixtures thereof may be done with a separate composition followed by metal plating the etched wafer with a separate metal plating composition. Conventional metal plating compositions may be used.

Bifluoride source compounds include, but are not limited to, alkali metal bifluorides such as sodium bifluoride and potassium bifluoride, ammonium fluoride, ammonium bifluoride, fluoborates, fluorboric acid, tin bifluoride, antimony bifluoride, tetrabutylammonium tetrafluoroborate, aluminum hexafluoride and quaternary salts of aliphatic amines, aromatic amines and nitrogen-containing heterocyclic compounds. Fluoride salts include, but are not limited to, alkali metal fluorides, such as sodium and potassium fluoride. Typically, bifluoride source compounds and fluoride salts are included in the compositions in amounts of 5 g/L to 100 g/L or such as from 10 g/L to 70 g/L or such as from 20 g/L to 50 g/L.

Acids which may be included in the compositions include, but are not limited to, sulfamic acid, alkane sulfonic acids such as methane sulfonic acid, ethane sulfonic acid and propane sulfonic acid; alkylol sulfonic acids; aryl sulfonic acids such as toluene sulfonic acid, phenyl sulfonic acid and phenol sulfonic acid; amino-containing sulfonic acids such as amido sulfonic acid; mineral acids, such as sulfuric acid, nitric acid and hydrochloric acid; amino acids, carboxylic acids including mono-, di- and tricarboxylic acids, their esters, amides and any unreacted anhydrides. Further, the compositions may contain a mixture of acids. When two or more carboxylic acids are included in the compositions at least one contains an acidic proton to form the bifluoride species. Such acids are generally commercially available from a variety of sources, such as Aldrich Chemical Company. In general, acids and acid anhydrides are included in the electrochemical compositions in amounts of 1 g/L to 300 g/L or such as from 10 g/L to 200 g/L or such as 30 g/L to 100 g/L.

The electrochemical compositions are prepared by combining stoichiometric quantities of one or more acid and one or more bifluoride source compounds or one or more fluoride salts or mixtures thereof. Mixing is done until the bifluoride components or fluoride salts are dissolved in the acid. Water may be added with further mixing to dissolve any un-solubilized components.

Alternatively, one or more acid anhydrides are added to an aqueous solution of at least one bifluoride source to form upon contact with water at least one carboxylic acid. One or more carboxylic acids may be present in the aqueous bifluoride source compound solution provided that enough acid anhydride is stoichiometrically employed to attain a water content of 1-5 wt %. This combination is then mixed until the acid anhydride hydrolyzes and the bifluoride source compound dissolves. Additional water may be added with further mixing until all of the components are dissolved.

Typically the electrochemical compositions include one or more alkali metal bifluoride, ammonium fluoride and ammonium bifluoride as the bifluoride source compound. More typically, the bifluoride source compound is an alkali metal bifluoride, such as sodium and potassium bifluoride. When the bifluoride source compound is an alkali metal bifluoride, one or more inorganic acids are included in the electrochemical composition, such as sulfamic acid. When the bifluoride source compound is ammonium bifluoride or ammonium fluoride, one or more carboxylic acids are included in the electrochemical composition. Typically a monocarboxylic acid is included, such as acetic acid.

Various metals may be used to plate a seed layer on the nanoporous emitter layer; however, typically the metals are nickel and its alloys, palladium and its alloys, silver and its alloys and cobalt and its alloys. More typically the metal is nickel or palladium. Most typically the metal is nickel. Nickel ions are provided by typically using a nickel salt. Such nickel compounds include, but are not limited to, nickel sulfate, nickel chloride, nickel bromide, nickel sulfamate, and nickel phosphate. Mixtures of nickel compounds may be used. Palladium ions are provided by using palladium compounds, typically a palladium salt. Such palladium salts include, but are not limited to, palladium chloride, palladium nitrate, palladium sodium chloride, palladium potassium chloride, potassium tetrachloropalladate and tatraamine palladium chloride. Mixtures of palladium compounds may be used. Silver ions are provided by using silver compounds. Such silver compounds include, but are not limited to silver nitrate, silver oxide, silver potassium cyanide, silver sodium thiosulfate and silver methane sulfate. Cobalt ions are provided by using cobalt compounds. Cobalt compounds include but are not limited to, cobalt chloride, cobalt bromide, cobalt sulfate, cobalt potassium cyanide, cobalt ammonium sulfate and cobalt acetate. The metal compounds are included in amounts sufficient to provide metal ion concentrations in amounts of 0.1 to 150 g/L, typically from 0.5 to 100 g/L, and more typically from 1 to 70 g/L.

Optionally a wide variety of surfactants can be used in the electrochemical compositions. Any of anionic, cationic, amphoteric and nonionic surfactants may be used as long as it does not interfere with the performance of the etching or metal plating. Surfactants may be included in conventional amounts.

Optionally, the electrochemical compositions contain one or more additional components. Such additional components include, without limitation, brighteners, grain refiners and ductility enhancers. Such additional components are well known in the art and are used in conventional amounts.

The electrochemical compositions optionally contain a buffering agent. Exemplary buffering agents include, but are not limited to, borate buffer (such as borax), phosphate buffer, citrate buffer, carbonate buffer, and hydroxide buffer. The amount of the buffer used is that amount sufficient to maintain the pH of the electrochemical composition at a desired level of 1 to 6 typically from 1 to 2.

The semiconductor wafer is immersed in the electrochemical composition contained in a chemically inert etching and plating cell. The working temperature of the electrochemical composition may be from 10 to 100° C., or such as from 20 to 50° C. A rear side potential (rectifier) is applied to the semiconductor wafer. An inert counter electrode is also immersed in the cell. Typically the counter electrode is a platinum wire or screen electrode. The cell, semiconductor wafer, electrochemical composition and rectifier are in electrical communication with each other.

An anodic potential is generated in the electrochemical composition and at the semiconductor wafer and maintained for a predetermined time followed by turning off current for a predetermined time and the cycle is repeated for a sufficient number of times to provide substantially uniform nanoporous layers on the oxidized emitter layer of the front side of the semiconductor wafer and at the same time penetrate the surface of the oxidized emitter layer such that the electrical performance of the semiconductor is not compromised. The method is a balance between emitter layer penetration to form a substantially uniform nanoporous emitter layer and a sheet resistivity which enables metal deposition resulting in metal layers with good adhesion and ohmic contact with the semiconductor wafer. In addition, the method is a balance between minimizing attack or damage to an antireflective coating on the emitter layer and at the same time forming a nanoporous emitter layer. The oxidized sections of the emitter layer are made nanoporous to a depth such that metal adheres well to the emitter layer and at the same time the resistivity of the emitter layer is conductive enough to plate metal. The deeper the nanoporous layer penetrates into the emitter layer, the greater the sheet resistivity of the emitter layer. In general, the substantially uniform nanoporous layer penetrates deep enough into the emitter layer such that the sheet resistivity of the emitter layer increases from 5% to 40%, or such as from 20% to 30% of the sheet resistivity of the emitter layer prior to initiating application of the anodic potential. Typically, the sheet resistivity of the uniform nanoporous emitter layer is 200 ohms/square and less. Factors such as emitter thickness and doping profile are also parameters to consider in determining emitter layer nanoporous depth and emitter layer resistivity. Minor experimentation may be done to determine the emitter layer nanoporous depth and emitter layer resistivity to achieve metal plating and good metal adhesion for a particular semiconductor wafer.

In general, current density during application of the anodic potential may range from 0.01 A/dm$^2$ to 2 A/dm$^2$ or such as from 0.05 A/dm$^2$ to 1 A/dm$^2$. However, minor experimentation may be done to determine preferred current density setting, time period for applying the anodic potential and turning it off for a particular semiconductor wafer. Such parameters depend on the thickness of the semiconductor wafer as well as starting thickness of the emitter layer and desired thickness of the nanoporous emitter layer. If the nanoporous portion of the emitter layer is too deep, the semiconductor may be damaged such that its sheet resistivity is increased. Too high a sheet resistivity compromises the electrical conductivity of the current tracks which are formed on the nanoporous sections of the emitter layer. In addition non-uniform nanoporous layers over the surface of the emitter may result in poor adhesion of subsequently plated metal layers. Typically anodic potential is applied for 0.5 seconds and greater or such as for 0.5 seconds to 2 seconds or such as from 3 seconds to 8 seconds. Time where the anodic potential is discontinued during the cycle may range from 1 second and greater or such as from 3 seconds to 10 seconds or such as 10 seconds to 50 seconds. The number of cycles may range from 5 to 80 or such as from 10 to 100.

If the patterned semiconductor wafer is a silicon solar cell, the light source can be, for example, a fluorescent or LED lamp which provides energy within the wavelengths to which the silicon solar cell is photovoltaically sensitive. A variety of other light sources may be used, such as, but not limited to, incandescent lamps such as a 75 watt and 250 watt lamp, mercury lamps, halogen lamps and a 150 watt infrared lamp. The light energy can be either continuous or pulsed. Pulsed illumination can be achieved, for example, by interrupting the light with a mechanical chopper or an electronic device may be used to cycle power to the lights intermittently based on a desired cycle. In general the amount of light applied to the semiconductor wafer during the light induced plating may be from 400 lx to 10,000 lx, or such as from 500 lx to 7500 lx.

By illuminating the front of the semiconductor wafer with light energy, plating occurs on the front. The impinging light energy generates a current in the semiconductor wafer. The rate of plating on the front is controllable by adjusting the light intensity, bath temperature, starting wafer conditions, doping level as well as other parameters which are known to workers in the art. A metal seed layer of 100 nm and greater or such as from 100 nm to 2 μm thickness is typically desired for the semiconductor wafer, with the exact thickness depending on various factors such as on the application, semiconductor size, pattern and geometry.

In an alternative embodiment the etching components for forming the nanoporous emitter layer and the metal plating formulation are included in separate solutions. After the wafer is placed in the etching solution where it is treated to form the substantially uniform nanoporous emitter layer it is then transferred to a separate metal plating solution for metal plating. If the wafer is to be oxidized to restore native oxide, the wafer is oxidized prior to etching. In another alternative embodiment the etching components and the oxidizing components may be combined in one composition while the metal is plated from a separate solution. After the front side of the semiconductor is oxidized, an anodic potential is applied to the semiconductor wafer as described above and the potential is pulsed from anodic to 0 to selectively etch the oxidized sections of the emitter layer of the semiconductor to form substantially uniform nanoporous layers. In this embodiment the same sources of bifluoride compounds, fluoride salts and acids are used as described above as well as the same amounts. Also, the same oxidizing agents as described above are used and in the same amounts.

A metal seed layer, typically of nickel, palladium, cobalt or silver is then selectively deposited on the substantially uniform nanoporous layer by light induced metal deposition. A rear side potential (rectifier) is applied to the semiconductor wafer as described above. The light may be continuous or pulsed. The semiconductor is immersed in the metal plating composition and light is applied to the semiconductor as described above.

Conventional electrolytic metal compositions may be used. Typical current densities are from 0.01 A/dm$^2$ to 2 A/dm$^2$ or such as from 0.05 A/dm$^2$ to 1 A/dm$^2$. The particular current requirement is dependent upon the particular size of the wafer used. The electroplating processes used are conventional. Suitable electrolytic metal plating baths are commercially available as well as many which are disclosed in the literature. Examples of commercially available electrolytic nickel baths are the NIKAL™ and NICKEL GLEAM™ series of nickel electrolytic products obtainable from Rohm and Haas Electronic Materials, LLC. Other examples of suitable electrolytic nickel plating baths are the Watts-type baths disclosed in U.S. Pat. No. 3,041,255.

After the metal seed layer is plated by the embodiments described above, one or more additional metal layers may be deposited on the metal seed layer. Such additional metal layers may be copper or silver. Conventional metal plating baths may be used. If the additional metal is copper, a tin strike layer may be deposited onto the copper to prevent oxidation. If the additional metal is silver, a silver strike layer may be deposited on the silver and may be followed by an additional silver layer on the strike. Such additional metal layers may be deposited by electroless, immersion, electrolytic, light induced metal plating using conventional plating baths and processes. Typically, such metal layers range from 1 μm to 50 μm, more typically, from 5 μm to 25 μm. Strike layers may range from 0.25 μm to 2 μm. If the additional metal layer is deposited electrolytically, typical current densities are from 0.1 A/dm$^2$ to 3 A/dm$^2$, and more typically from 1 A/dm$^2$ to 3 A/dm$^2$. The total current requirement is dependent upon the particular size of the wafer used.

Sources of such metals for the additional metal layers may include, without limitation: metal halides; metal nitrate; metal carboxylates such as acetate, metal formate and metal gluconate; metal-amino acid complexes such as metal-cysteine complexes; metal alkyl sulfonates such as metal methane sulfonate and metal ethane sulfonate; metal alkylol sulfonates, metal tolyl sulfonates, and metal phenol sulfonates; and metal cyanides. When the metal is silver, the metal salt is typically not a silver halide due to the limited solubility of such salts. Examples of copper compounds include, but are not limited to, copper pyrophosphate, copper gluconate, copper sulfate and copper chloride. Examples of tin compounds include, but are not limited to, tin chloride, tin sulfate and tin methane sulfonate. Mixtures of metal compounds may be used. Such mixtures may be metal compounds having the same metal but being different compounds, such as a mixture of silver nitrate and silver-cysteine complex.

In general the metal compounds are added to plating baths in an amount sufficient to provide a metal ion concentration in the plating composition of 0.1 to 150 g/L. When the metal ions are silver ions, the concentration of silver ions in the bath is typically in an amount of 2 to 40 g/L. Such metal compounds are generally commercially available from a variety of sources, such as Aldrich Chemical Company, Milwaukee, Wis. Examples of a commercially available baths are COPPER GLEAM™ ST 901 and 901A Copper Electroplating baths and ENLIGHT™ Silver Plate 620 silver electroplating bath both from Rohm and Haas Electronic Materials, LLC Marlborough, Mass. Examples of commercially available tin baths are the SOLDERON™ Tin Plating compositions and ancillary products also available from Rohm and Haas Electronic Materials.

A wide variety of conventional surfactants may be used in the metal plating baths. Any of anionic, cationic, amphoteric and nonionic surfactants may be used. Surfactants may be included in conventional amounts.

The metal plating baths may contain one or more additional conventional components. Such additional components include, without limitation, electrolytes, buffers, brighteners, grain refiners, chelating agents, complexing agents, reducing agents, levelers and ductility enhancers. Such additional components are well known in the art and are used in conventional amounts.

The methods form substantially uniform nanoporous layers at the surface of the emitter layer of the front side of semiconductor wafers. The nanoporous layers provide improved adhesion between the metal deposit and the semiconductor wafer. In addition the process used to form the nanoporous layers does not penetrate the emitter layer of the semiconductor wafer such that the emitter is damaged such that ohmic contact between the nickel seed layer and the semiconductor wafer is compromised. Subsequent metal layers may then be deposited on the metal seed layer without concern for adhesion failure thus improving the reliability of devices which include the metalized semiconductor. Also, the method may eliminate the need for forming a metal silicide and the complicated steps involved in the silicide process.

The electrochemical etch methods have been described with particular reference to silicon wafers used in solar cells; however, photovoltaic devices fabricated from materials other than silicon may also be used, with appropriate changes where necessary, for example, in the source of light energy employed.

The following examples are included to illustrate various aspects of the invention but are not intended to limit the scope of the invention.

EXAMPLE 1

A doped monocrystalline silicon wafer having pyramidal elevations on its front side was provided. The wafer had an n+ doped zone on the front side of the wafer forming an emitter layer. The wafer also had a PN-junction below the emitter layer. The front side of the wafer was coated with an antireflective layer composed of SiNx. The front side of the wafer had a pattern for current tracks through the antireflective layer which exposed the surface of the silicon wafer. Each current track traversed the entire length of the wafer. The current tracks joined a bus bar at an end of the wafer and at the center of the wafer. The back side of the wafer was p+ doped and contained an aluminum electrode.

The wafer was immersed in a 1 wt % hydrofluoric acid solution to clean the current tracks and busbar. Cleaning was done for one minute at room temperature. The wafer was rinsed with water. In addition to removing contaminants from the wafer, the hydrofluoric acid solution also removed native oxide from the surface of the emitter layer.

The doped mononcrystalline silicon wafer was then immersed into a plating cell containing ENLIGHT™ 1300 Nickel Sulfamate electroplating solution. The rear side aluminum electrode of the wafer was connected to a rectifier and a solid nickel anode functioned as the counter electrode in the bath. The wafer functioned as the cathode and the nickel was the anode. The bath, wafer and counter electrode were all in electrical communication and a cathodic current of $1 \text{ A/dm}^2$ was applied for one minute. Artificial light was applied to the wafer throughout the plating cycle. The light source was a 250 watt halogen lamp. Plating temperatures ranged from 30° C. to 50° C. A nickel seed layer of 300 nm was deposited on the current tracks and busbar.

The wafer was then placed in an electrolytic plating cell containing COPPER GLEAM™ 125 Electrolytic Copper plating bath (available from Rohm and Haas Electronic Materials). The rear side aluminum electrode of the wafer was connected to a rectifier and a phosphorized copper anode functioned as the counter electrode in the bath. The wafer functioned as the cathode. The bath, wafer and counter electrode were all in electrical communication and a cathodic current of $1.5 \text{ A/dm}^2$ was applied for 14 minutes to deposit a 6-10 μm layer of copper on the nickel seed layer on each current track and busbar. Artificial light was again applied to the wafer throughout plating. The light source was a 250 watt halogen lamp. Plating temperatures ranged from 20° C. to 50° C.

The wafer was removed from the plating cell and the adhesion of the metal layers to the current tracks and busbars were tested. The ASTM D3359-97 standard tape test was used to test the adhesion of the metal layers. Although the metal layers on the busbars did not peel, all of the metal layers at the current tracks peeled from the wafer. Adhesion failed at the interface between the nickel and the silicon of the wafer.

EXAMPLE 2

The method described in Example 1 above was repeated except that silver was electroplated on the nickel seed layer instead of copper. Silver was plated on the nickel using ENLIGHT™ Silver Plate 620 silver electroplating bath. The current density was $1.5 \text{ A/dm}^2$ and plating was done for 10 minutes. Artificial light was also applied to the wafer throughout plating. The light source was a 250 watt halogen lamp. Plating temperatures ranged from 20° C. to 40° C. 8-10 μm layer of silver was deposited on the nickel.

The ASTM D3359-97 standard tape test was used to test the adhesion of the metal layers. Adhesion failed at the interface between the nickel and the silicon of the wafer on all of the current tracks as well as the busbars.

EXAMPLE 3

The same type of monocrystalline wafer was provided as in Example 1 above. The wafer was placed on a metal plating rack, with the back side aluminum electrode in direct contact with the metal plating rack. The interface between the cell and rack was sealed along the perimeter of the wafer, to minimize solution penetration between the back side of the cell and plating rack. During anodic cycling, current from the rectifier flowed through the rack, and into the cell through the rear side contact.

The current tracks and busbar were then oxidized with a 5 wt % aqueous hydrogen peroxide solution to ensure that the silicon surface was oxidized. The wafer, racked as described in previous paragraph, was then immersed into an aqueous composition in a plating cell which included 10 g/L of nickel ions from nickel sulfamate, 45 g/L of sodium bifluoride and 15 g/L of sulfamic acid. The rack with wafer was connected to a rectifier and a platinum wire was used as a counter electrode. The aqueous composition, wafer and platinum wire were in electrical communication with each other. Anodic current was applied at the wafer for 30 seconds at a current density of $0.2 \text{ A/dm}^2$. The aqueous composition was at room temperature.

After the current tracks and bus bars were etched to form a substantially uniform nanoporous layer, artificial light was applied to the wafer and the rectifier polarity was reversed to make the cell cathodic and the platinum electrode anodic. The light source was a 250 watt halogen lamp. The current density remained at $0.1 \text{ A/dm}^2$ and a nickel seed layer of 100 nm to 500 nm was plated on the etched current tracks and busbars. Light induced plating was done for 30 seconds.

The nickel plated wafer was then placed in an electrolytic plating cell containing ENLIGHT 420 Electrolytic Copper plating bath (available from Rohm and Haas Electronic Materials). The rear side aluminum electrode of the wafer was connected to a rectifier and a copper anode functioned as the counter electrode in the bath. The wafer functioned as the cathode and the platinum wire was the anode. The bath, wafer and counter electrode were all in electrical communication and a cathodic current of $2 \text{ A/dm}^2$ was applied for 14 minutes to deposit a 6-10 μm layer of copper on the nickel seed layer on each current track and busbar. Artificial light was again applied to the wafer during plating. The light source was a 250 watt halogen lamp. Plating temperatures ranged from 20° C. to 50° C.

The wafer was removed from the plating cell and the adhesion of the metal layers to the current tracks and busbars were tested. The ASTM D3359-97 standard tape test was used to test the adhesion of the metal layers. There was no observable evidence of any metal on the tape or any indication of the separation of metal layers from the wafer even at the nickel and silicon interface.

EXAMPLE 4

The method described in Example 3 above was repeated except that silver was plated on the nickel seed layer instead of copper. Silver was plated on the nickel using a silver strike electroplating solution of ENLIGHT™ Silver Plate 620 electroplating bath with a silver ion concentration of 1 g/L followed by plating a silver layer on the silver strike with ENLIGHT™ Silver Plate 620 electroplating bath. A voltage of 2 to 2.5 V was applied for 30 seconds to 1 minute in the strike solution, after which the wafer was immediately transferred to the other silver bath where it was plated at $2 \text{ A/dm}^2$ for 10 minutes. The artificial light source was a 250 watt halogen lamp. Plating temperatures ranged from 20° C. to 40° C. An 8 to 10 μm layer of silver was deposited on the nickel.

The ASTM D3359-97 standard tape test was used to test the adhesion of the metal layers. All of the metal deposits on the current tracks and the bus bars remained intact. There was no observable evidence of any metal on the tape or any indication of the separation of metal layers from the wafer even at the nickel and silicon interface.

EXAMPLE 5

The same type of monocrystalline wafer as described in Example 1 was racked as described in Example 3.

The wafer was then immersed into an aqueous composition in a plating cell which included 15 g/L of sodium bifluoride and 30 g/L of sulfamic acid. The rack with wafer was connected to a rectifier and a platinum wire was used as a counter electrode. The aqueous composition, wafers and platinum wire were in electrical communication with each other. The composition was mildly agitated and kept at room temperature. Anodic current of 0.1 A/dm$^2$ at 1.2V was initially applied at the wafer for two seconds and then the current was turned off for 1 second. The anodic to 0 current pulsing was repeated for 30 cycles. After the current tracks and bus bars were etched to form a substantially uniform nanoporous emitter layer, the cell was removed from the aqueous composition and rinsed with deionized water.

The doped mononcrystalline silicon wafer was racked and then immersed into a plating cell containing ENLIGHT™ 1300 Electrolytic Nickel plating chemistry. The rack with wafer was connected to a rectifier and a solid nickel anode functioned as the counter electrode in the bath. The wafer functioned as the cathode. The bath, wafer and counter electrode were all in electrical communication and a cathodic current of 1 A/dm$^2$ was applied for 1 minute. Artificial light was applied to the wafer throughout the plating cycle. The light source was a 250 watt halogen lamp. Plating temperatures ranged from 30° C. to 50° C. Plating continued until a nickel seed layer of 300 nm was deposited in the current tracks and busbar.

The nickel plated wafer was then placed in an electrolytic plating cell containing ENLIGHT 420 Electrolytic Copper plating bath. The rack with wafer was connected to a rectifier and a copper anode functioned as the counter electrode in the bath. The bath, wafer and counter electrode were all in electrical communication and a cathodic current of 2 A/dm$^2$ was applied for 14 minutes to deposit a 6-10 μm layer of copper on the nickel seed layer on each current track and busbar. Artificial light was again applied to the wafer during plating. The light source was a 250 watt halogen lamp. Plating temperatures ranged from 20° C. to 50° C.

The wafer was removed from the plating cell and the adhesion of the metal layers to the current tracks and busbars were tested. The ASTM D3359-97 standard tape test was used to test the adhesion of the metal layers. Although the metal layers on the busbars did not peel, some sporadic areas on the current tracks peeled from the wafer. Where adhesion failure occurred, it was at the interface between the nickel and the silicon of the wafer

EXAMPLE 6

The method of example 5 was repeated except that the number of porous recitifier cycles was increased from 30 to 45. All other preparation and conditions were the same.

The wafer was removed from the plating cell and the adhesion of the metal layers to the current tracks and busbars were tested. The ASTM D3359-97 standard tape test was used to test the adhesion of the metal layers. All of the metal deposits on the current tracks and the busbars remained intact. There was no observable evidence of any metal on the tape or any indication of the separation of metal layers from the wafer even at the nickel and silicon interface.

EXAMPLE 7

The method of example 5 was repeated except that the number of porous rectifier cycles was increased from 30 to 60. All other preparation and conditions were the same.

The wafer was removed from the plating cell and the adhesion of the metal layers to the current tracks and busbars were tested. The ASTM D3359-97 standard tape test was used to test the adhesion of the metal layers. All of the metal deposits on the current tracks and the bus bars remained intact. There was no observable evidence of any metal on the tape or any indication of the separation of metal layers from the wafer even at the nickel and silicon interface.

EXAMPLE 8

The method of examples 5 was repeated up through formation of the porous silicon layer in the etching solutions.

Figure 1:
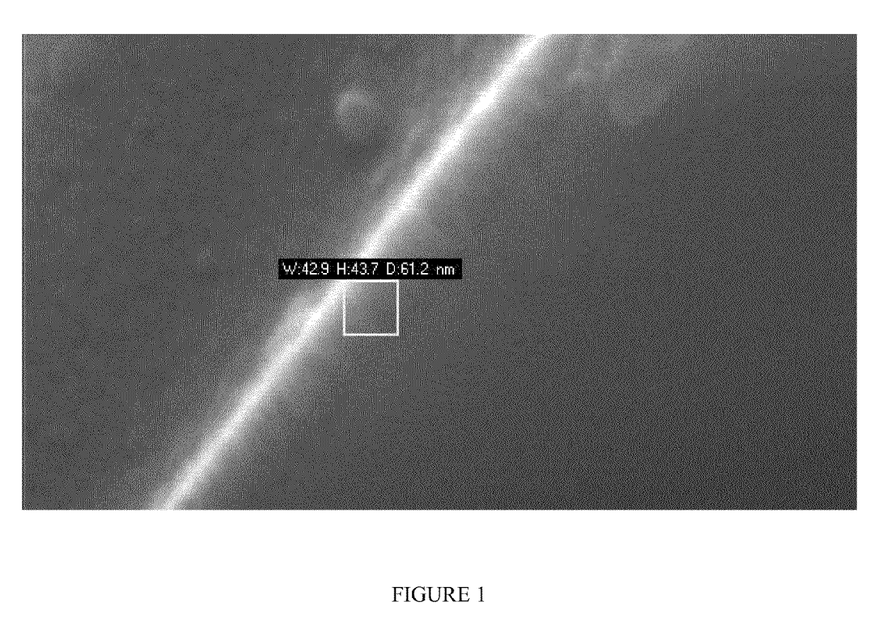
FIG. 1 is a SEM of the front side emitter layer of a monocrystalline silicon wafer at 170,000× which was etched with an aqueous acidic composition of sodium bifluoride using an anodic pulsing method to form a uniform nanoporous layer to a depth of 61.2 nm.

The emitter layer was then examined with an AMRAY 1910 secondary electron microscope. A substantially uniform nanoporous layer was formed on the surfaces of the pyramid structures of the emitter layer. FIG. 1 is a 170,000× SEM of the surface of one of the pyramid structures. As shown in FIG. 1 and exemplified by the rectangular box a nanoporous layer with a depth of 61.2 nm (upper left corner to lower right corner of box) was formed on the surface of the pyramid structure of the emitter layer. The width of the box was measured to be 42.9 nm (left to right) and the height of the box was measured to be 43.7 nm (top to bottom).

EXAMPLE 9

The method of examples 7 was repeated up through formation of the porous silicon layer in the etching solutions.

In addition, the sheet resistivity ($\rho_0$) of the emitter layer prior to nanopore formation was measured at 17 ohms/square using a Jandel Engineering Ltd. Model HM20. Nanopore formation was done by the same process as described above except the anodic current to 0 current pulse was done for 60 cycles. After nanopore formation the sheet resistivity ($\rho_1$) of the emitter layer was measured and was determined to be 23 ohms/square. The emitter layer sheet resistivity increased by 6 ohms/square or by 39% and within a range for metal plating on the nanoporous emitter layer surface such that the metal layers plated on the emitter layer would have good adhesion.

Figure 2:
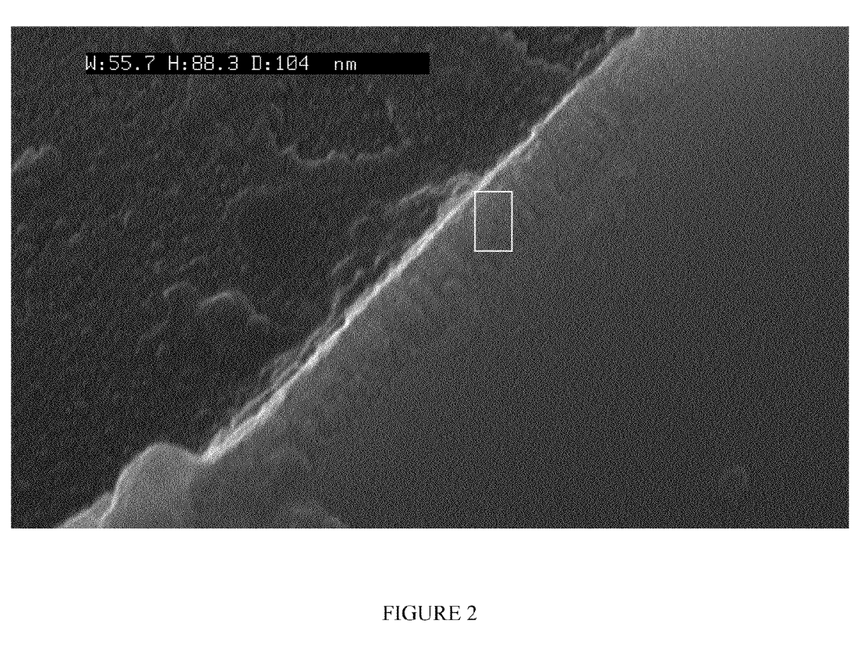
FIG. 2 is a SEM of the front side emitter layer of a monocrystalline wafer at 100,000× which was etched with an aqueous acidic composition of sodium bifluoride using an anodic pulsing method to form a uniform nanoporous layer to a depth of 104 nm.

The emitter layer was then examined with an AMRAY 1910 secondary electron microscope. A substantially uniform nanoporous layer was formed on the surfaces of the pyramid structures of the emitter layer. FIG. 2 is a 100,000× SEM of the surface of one of the pyramid structures. As shown in FIG. 2 and exemplified by the rectangular box a nanoporous layer having a depth of 104 nm (upper left corner to lower right corner of box) was formed on the surface of the pyramid structure of the emitter layer. The width of the box was measured to be 55.7 nm (left to right) and the height of the box was measured to be 88.3 nm (top to bottom).

EXAMPLE 10

The method of example 6 was repeated up through formation of the porous silicon layer in the etching solutions.

Figure 3:
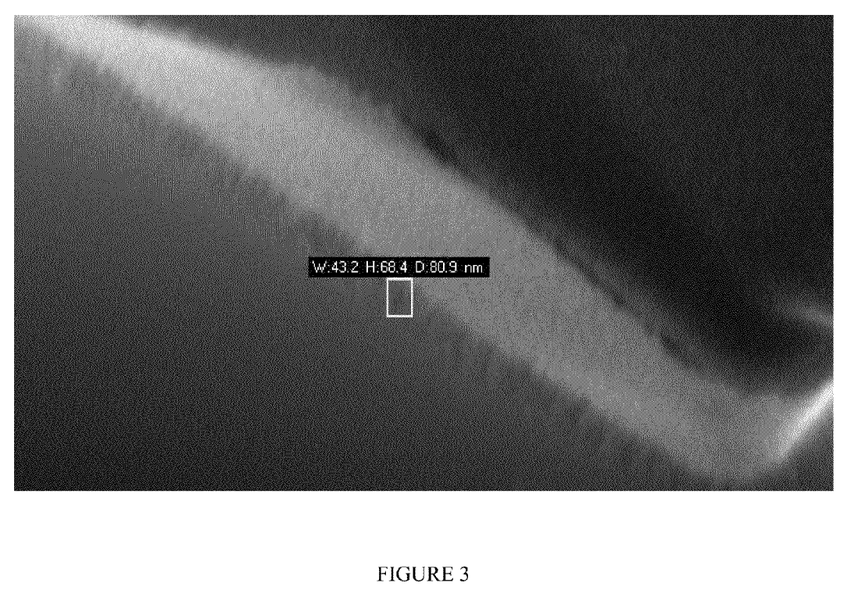
FIG. 3 is a SEM of the front side emitter layer of a monocrystalline wafer at 75,000× which was etched with an aqueous acidic composition of sodium bifluoride using an anodic pulsing method to form a uniform nanoporous layer to a depth of 80.9 nm.

Nanopore formation was done by the same process as described above except the anodic current to 0 current pulse was done for 45 cycles. The emitter layer was then examined with an AMRAY 1910 secondary electron microscope. A substantially uniform nanoporous layer was formed on the surfaces of the pyramid structures of the emitter layer. FIG. 3 is a 75,000× SEM of the surface of one of the pyramid structures. As shown in FIG. 3 and exemplified by the rectangular box a nanoporous layer having a depth of 80.9 nm (upper left corner to lower right corner of box) was formed on the surface of the pyramid structure of the emitter layer. The width of the box was measured to be 43.2 nm (left to right) and the height of the box was measured to be 68.4 nm (top to bottom).

What is claimed is:

1. A method comprising:
    a) providing a semiconductor wafer comprising a front side comprising an emitter layer comprising oxidized sections, a back side and a PN junction;
    b) contacting the semiconductor wafer with a composition consisting of alkali metal bifluorides, sulfamic acid and water;
    c) generating a current in the composition;
    d) applying anodic current for a predetermined time, followed by turning the anodic current off for a predetermined time and repeating the cycle to form a nanoporous layer on the oxidized sections of the emitter layer of the semiconductor wafer, wherein a sheet resistivity of the emitter layer is increased by 5% to 40% of the sheet resistivity of the emitter layer prior to application of the anodic current;
    e) contacting the semiconductor wafer with a metal plating solution; and
    f) generating an electrical current in the metal plating solution to deposit metal on the nanoporous emitter layer.

2. The method of claim 1, wherein the metal is nickel.

3. The method of claim 2, further comprising depositing copper or silver on the nickel.

4. The method of claim 3, further comprising depositing a tin strike on the copper.

5. The method of claim 3, further comprising depositing a silver strike on the silver.

6. The method of claim 1, wherein the sheet resistivity of the emitter layer is increased by 20% to 30% of the sheet resistivity of the emitter layer prior to application of the anodic current.

* * * * *